(12) United States Patent
Yang et al.

(10) Patent No.: US 8,917,153 B2
(45) Date of Patent: Dec. 23, 2014

(54) SUPPORTED POT MAGNET FOR MAGNETIC RESONANCE SYSTEM

(71) Applicants: Lei Yang, Shenzhen (CN); Bu Qing Zhang, Shenzhen (CN)

(72) Inventors: Lei Yang, Shenzhen (CN); Bu Qing Zhang, Shenzhen (CN)

(73) Assignees: Siemens Aktiengesellschaft, Munich (DE); Siemens Shenzhen Magnetic Resonance Ltd., Shenzhen (CN)

( * ) Notice: Subject to any disclaimer, the term of this patent is extended or adjusted under 35 U.S.C. 154(b) by 0 days.

(21) Appl. No.: 13/905,532

(22) Filed: May 30, 2013

(65) Prior Publication Data

US 2013/0321109 A1    Dec. 5, 2013

(30) Foreign Application Priority Data

May 30, 2012    (CN) .......................... 2012 1 0174255

(51) Int. Cl.
| | |
|---|---|
| *H01F 6/00* | (2006.01) |
| *G01R 33/38* | (2006.01) |
| *G01R 33/3815* | (2006.01) |
| *H01F 6/04* | (2006.01) |
| *H01F 6/06* | (2006.01) |

(52) U.S. Cl.
CPC .............. *H01F 6/04* (2013.01); *G01R 33/3802* (2013.01); *G01R 33/3815* (2013.01); *G01R 33/3804* (2013.01); *H01F 6/06* (2013.01)
USPC .......................................... 335/216; 335/300

(58) Field of Classification Search
CPC ...................................... H01F 6/04; H01F 6/06
USPC ................ 335/299–300, 216; 336/55–62, 96, 336/DIG. 1; 324/318–320; 505/892, 893
See application file for complete search history.

(56) References Cited

U.S. PATENT DOCUMENTS

| | | | |
|---|---|---|---|
| 7,319,327 B2 | 1/2008 | Ryan et al. | |
| 7,319,329 B2 | 1/2008 | Huang et al. | |
| 7,449,889 B1 | 11/2008 | Huang et al. | |
| 7,487,767 B2 * | 2/2009 | Shimada et al. | 123/634 |
| 7,522,027 B2 * | 4/2009 | Calvert et al. | 335/299 |
| 7,616,083 B2 * | 11/2009 | Gilgrass | 335/216 |
| 7,626,477 B2 * | 12/2009 | Huang et al. | 335/216 |
| 2009/0033450 A1 | 2/2009 | Huang et al. | |

* cited by examiner

*Primary Examiner* — Ramon Barrera
(74) *Attorney, Agent, or Firm* — Schiff Hardin LLP

(57) ABSTRACT

A supported pot magnet has a magnet coil and a coil former, with the coil former being made of a non-metallic material having a thermal contraction coefficient the same as that of the magnet coil. The supported pot magnet also has a cooling circulator composed of two identical separate components with a semi-cylindrical shape, each having multiple cooling tubes, a refrigerant inlet tube, a refrigerant outlet tube, and multiple clamps. The cooling tubes have a semicircular shape and mate with the slots, and are provided thereon with heat conducting members that are vertically disposed at an inner side of the cooling tubes. The refrigerant inlet tube and outlet tube are vertically mounted at two ends of the cooling tubes, in communication with the cooling tubes. The clamps are disposed on the refrigerant inlet tube and outlet tube.

7 Claims, 3 Drawing Sheets

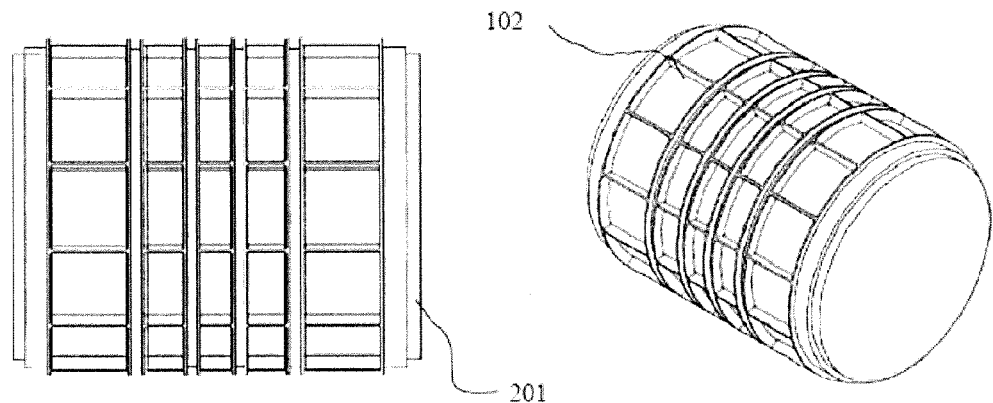
*Fig. 2A*           *Fig. 2B*
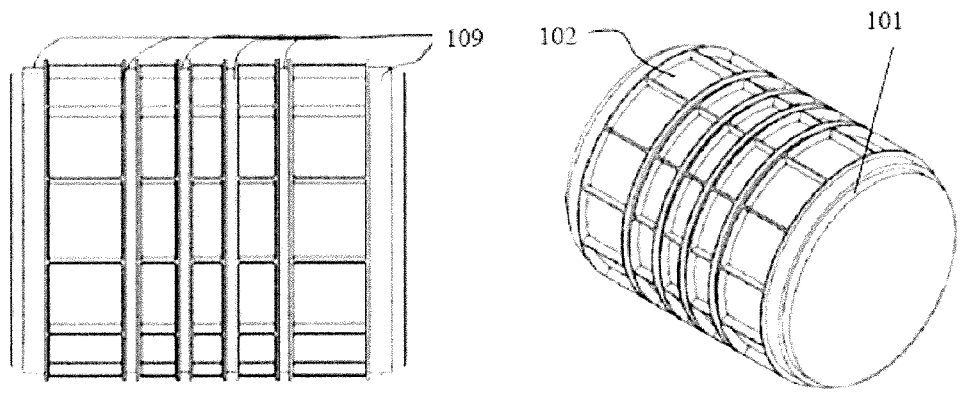
*Fig. 3A*           *Fig. 3B*

SUPPORTED POT MAGNET FOR MAGNETIC RESONANCE SYSTEM

BACKGROUND OF THE INVENTION

1. Field of the Invention

The present invention generally relates to magnetic resonance technology, and specifically to a magnet for a magnetic resonance system, particularly a supported pot magnet.

2. Description of the Prior Art

In a magnetic resonance imaging (MRI) system, a superconducting magnet is used to generate a strong and uniform magnetic field, in which a patient or other subjects are located. A gradient coil and a radio frequency transmitting and receiving coil then exert an influence on the gyromagnetic substance in the subject, thereby exciting a signal capable of being used for the forming of a useful image. Other systems using such coils include a spectroscopic system, a magnetic energy storage system, and a superconducting generator.

Conventionally, the superconducting magnet is placed in a cryostat that has a thermal shield and a vacuum container that isolate the magnet from the external environment during operation. The superconducting magnet further has a coil supporting structure for supporting the coil in a helium vessel and in a cold mass for cooling purposes. The helium vessel is a pressurized vessel located in the vacuum container for thermal insulation, and generally contains liquid nitrogen for cooling the superconducting magnet, so as to maintain the temperature at about 4.2 K, thereby enabling the superconducting effect. However, because liquid helium is a scarce resource, the high cost has an obvious influence on the application of MRI in the field of medical care. Accordingly, reducing the use of liquid helium in superconducting magnets has become the subject of much current research. Compared with a conventional magnet cooling method, the use of a small amount of liquid helium as a circulating coolant in a cooling tube is a quite promising magnet cooling method due to the effective reduction of the usage amount of the liquid helium.

However, in this method, the thermal stability of the superconducting magnet becomes a crucial problem. In clinical scanning application, the gradient coil system transfers excess eddy heat to the magnet, causing thermal quenching of the superconducting coil. Therefore, how to reduce eddies and effectively cool the superconducting coil, are core tasks in implementing the method.

Numerous solutions for using a small amount of liquid helium as the circulating coolant in a cooling tube are described in the patented art. For example, U.S. Pat. Nos. 7,449,889, 7,319,327, 7,319,329, and US Patent Application Publication No. 20090033450 describe methods of reducing eddy heat transfer and improving cooling efficiency in cooling methods where the cooling tube is in contact with the magnet coil. These above patented technologies disclose the use of a non-metallic coil former and a non-metallic suspended structure can greatly reduce eddy heat and improve the cooling efficiency, but there is generally quite a large difference between the thermal contraction coefficients of metallic material and non-metallic material, which causes the superconducting coil to suffer a surface stress resulting from a larger thermal contraction. There are no solutions to this problem provided in the prior art.

Moreover, the problem of fabrication precision is not mentioned in the above patents, but in practice the fabrication precision can largely affect the magnetic field homogeneity, and the surface stress of the magnet coil under thermal contraction and electromagnetic action. Although U.S. Pat. No. 7,319,329 describes a method for reducing heat transfer between the magnetic coil and the coil former, the method is quite complex in implementation, and the assembly precision is difficult to ensure unless there is a fairly advanced fabrication process, making the method difficult to be realized.

SUMMARY OF THE INVENTION

In view of the above, an object of the present invention is provided to provide a supported pot magnet for a magnetic resonance system, that can reduce eddies and effectively cool the superconducting coil, thereby solving the problem of a superconducting magnet losing its superconducting state due to the difference between the thermal contraction coefficients of metallic materials and non-metallic materials. Furthermore, the supported pot magnet for a magnetic resonance system is not only easy to fabricate but also can ensure assembly precision.

In order to achieve the above objects, a supported pot magnet is provided that, in accordance with the invention, has a magnet coil, a coil former, and a cooling circulator, the coil former having a number of slots, and the magnet coil being wound in the slots, and wherein the coil former is made of a non-metallic material, and the difference between the thermal contraction coefficients of the non-metallic material and the magnet coil is less than or equal to 10% of the thermal contraction coefficient of the magnet coil.

Preferably, the cooling circulator is formed by engaging two separate components, with each of the separate components including a number of cooling tubes, a refrigerant inlet tube, a refrigerant outlet tube, and a number of clamps. The multiple cooling tubes are of a semicircular shape and mate with the slots. The refrigerant inlet tube and the refrigerant outlet tube are respectively mounted at two ends of the multiple cooling tubes and are in communication with the multiple cooling tubes. The multiple clamps are disposed on the refrigerant inlet tube and the refrigerant outlet tube, so as to engage the two separate components.

Preferably, the two separate components are identical.

Preferably, a number of metallic heat conducting members, each having a width matching the inner diameter of the slots, are uniformly distributed at an inner side of the cooling tube that proceeds vertically to the cooling tubes, with the heat conducting members being in direct contact with the magnet coil.

Preferably, the heat conducting members are of a sheet shape or a cylindrical shape.

Preferably, the non-metallic material is poly-phenylene sulphide.

Preferably, the supported pot magnet is encapsulated by a resin.

Preferably, the resin is blended with glass beads.

The present invention solves the problem of the superconducting magnet losing its superconducting state due to the difference between the thermal contraction coefficients of metallic materials and non-metallic materials, and has the advantages of being easy to fabricate and to enable assembly precision to be ensured.

BRIEF DESCRIPTION OF THE DRAWINGS

FIG. 2A is a side view of a coil former of a supported pot magnet for a magnetic resonance system according to the present invention.

FIG. 2B is a three-dimensional view of a coil former and a coil installation tool of a supported pot magnet for a magnetic resonance system according to the present invention.

FIG. 3A is a side view of a coil former of a supported pot magnet for a magnetic resonance system according to the present invention.

FIG. 3B is a three-dimensional view of a coil former and a magnet coil of a supported pot magnet for a magnetic resonance system according to the present invention.

DESCRIPTION OF THE PREFERRED EMBODIMENTS

Figure 1:
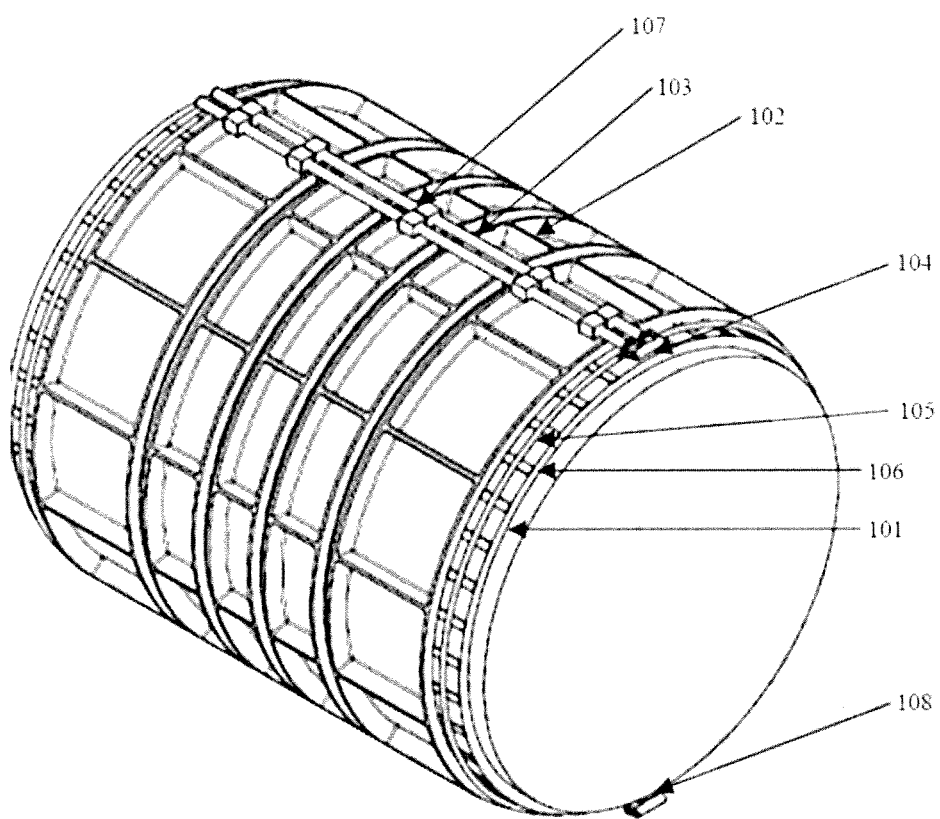
FIG. 1 shows a supported pot magnet for a magnetic resonance system according to the present invention.

Aiming at the problems existing in the prior art described in the background art section, the present invention proposes a supported pot magnet for a magnetic resonance system, which supported pot magnet comprises a magnet coil, a coil former, and a cooling circulator. The present invention will be described in detail through particular embodiments. FIG. 1 shows a supported pot magnet for a magnetic resonance system according to the present invention.

As shown in FIG. 1, a supported pot magnet 100 comprises a magnet coil 101, a coil former 102, and a cooling circulator 103. Among them, the magnet coil 101 is wound in a plurality of slots 109 of the coil former 102, thereby generating a superconducting magnetic field after the current is switched on in a superconducting environment.

The coil former 102 has a generally cylindrical shape, with a number of round slots 109, which are parallel to each other and vertical to a central axis of the coil former 102 is disposed at two ends and a middle portion of the coil former 102. The slots 109 are configured to wind the magnet coil 101. The coil former 102 is made of a non-metallic material, and the non-metallic material has a thermal contraction coefficient that is the same as or close to that of the magnet coil 101, or otherwise, the thermal contraction between the coil former 102 and the magnet coil 101 may cause the magnet to lose the superconducting state. In this specific embodiment, the non-metallic material has a thermal contraction coefficient that is different from that of the magnet coil by 10% or less. In order to have very close thermal contraction coefficients between the non-metallic material and the magnet coil, preferably polyphenylene sulphide (PPS, also referred to as engineering plastics) is used for the material of the coil former 102. By virtue of the structure and features of the abovementioned coil former 102, the homogeneity of the magnetic field can be greatly improved and the superconducting failure rate of the magnetic field can be reduced.

The cooling circulator 103 is constituted by engaging two identical separate semi-cylindrical components, each of them having a number of cooling tubes 105, a refrigerant inlet tube 104, a refrigerant outlet tube 108, and a number of clamps 107. The cooling tubes 105 are of a semicircular shape, parallel to each other, and mated with the slots 109 of the coil former 102, i.e., the multiple cooling tubes 105 of the cooling circulator 103 can be embedded into the multiple slots 109 of the coil former 102. The cooling tubes 105 are provided with a number of short sheet-like heat conducting members 106 thereon that are made of a metal having good thermal conducting performance. The heat conducting members 106 proceed vertically to the cooling tubes 105 and are uniformly distributed at an inner side of the circumference of the cooling tubes 105. The heat conducting members 106 have a length matching the inner diameter of the slots 109 so as to directly contact with the magnet coil 101. The refrigerant inlet tube 104 and the refrigerant outlet tube 108 are arranged at two ends of the cooling tubes 105 vertically to the cooling tubes 105, with the refrigerant inlet tube 104 and the refrigerant outlet tube 108 being in communication with each of the cooling tubes 105 to provide refrigerant circulation for each of the cooling tubes 105. The two separate components are engaged into a complete cooling circulator 103 to cover the slots 109 in the coil former 102, so as to cool the magnet coil 101 wound in the slots 109. The multiple clamps 107 are disposed on the refrigerant inlet tube 104 and the refrigerant outlet tube 108, so as to join the two separate components. The clamps 107 provide an appropriate force for the thermal contact between the heat conducting members 106 and the magnet coil 101. As described above, the cooling circulator 103 is fabricated separately from the coil former 102, and the cooling tubes 105 of the cooling circulator 103 are also not in direct contact with the magnet coil 101, thus causing no damage to the magnet coil 101 during fabrication and assembling of the cooling circulator 103.

The heat conducting members 106 can not only be sheet-like but also of a cylindrical shape. The main function of the heat conducting members 106 is to increase the thermal contact area between the cooling tubes and the magnet coil, thereby improving the cooling efficiency and avoiding the physical damage caused by the direct contact between the cooling tubes and the magnet coil at the same time.

In order to improve the refrigeration efficiency, the supported pot magnet 100 may be encapsulated with a resin, thereby strengthening the thermal contact between the heat conducting members 106 and the magnet coil 101. In order to improve the strength of the integral structure of the supported pot magnet 100, glass beads may be added to the resin for encapsulating the supported pot magnet 100.

Figure 4A:
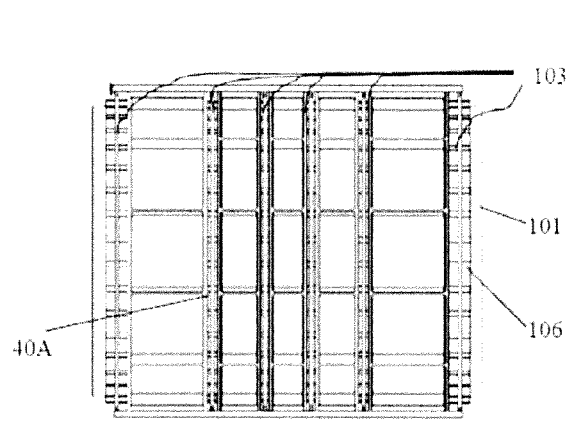
FIG. 4A is a side view of a coil former and a cooling circulator of a supported pot magnet for a magnetic resonance system according to the present invention.
Figure 4B:
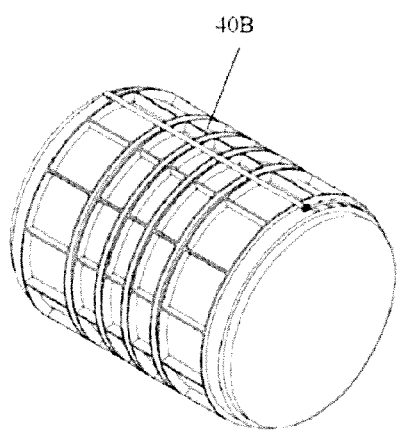
FIG. 4B is a three-dimensional view of a coil former and an individual separate component of a cooling circulator, of a supported pot magnet for a magnetic resonance system according to the present invention.
Figure 5A:
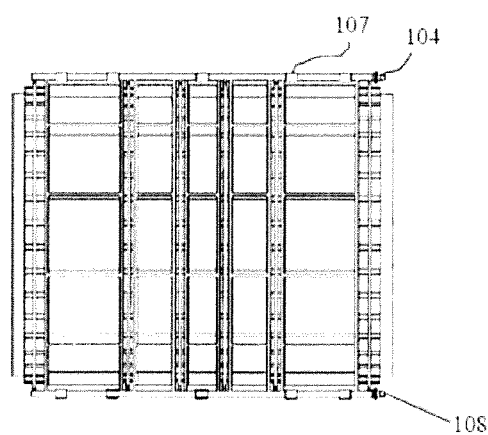
FIG. 5A is a side view of a coil former, and a cooling circulator and clamps thereof, of a supported pot magnet for a magnetic resonance system according to the present invention.
Figure 5B:
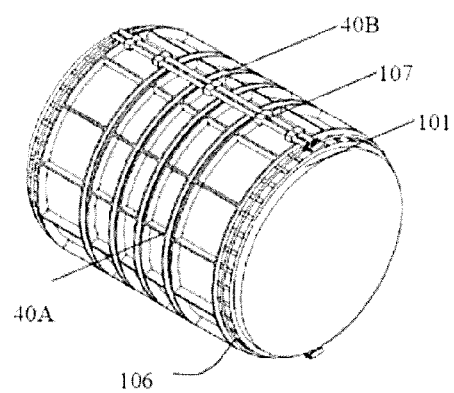
FIG. 5B is a three-dimensional view of a supported pot magnet for a magnetic resonance system according to the present invention.

The present invention also has the goal of simplifying the process for fabricating a supported pot magnet. A process for assembling a supported pot magnet for a magnetic resonance system according to the present invention is described with reference to FIGS. 2A through 5B. FIG. 2A is a side view of a coil former of a supported pot magnet for a magnetic resonance system according to the present invention. FIG. 2B is a three-dimensional view of a coil former and a coil installation tool of a supported pot magnet for a magnetic resonance system according to the present invention. FIG. 3A is a side view of a coil former of a supported pot magnet for a magnetic resonance system according to the present invention. FIG. 3B is a three-dimensional view of a coil former and a magnet coil of a supported pot magnet for a magnetic resonance system according to the present invention. FIG. 4A is a side view of a coil former and a cooling circulator of a supported pot magnet for a magnetic resonance system according to the present invention. FIG. 4B is a three-dimensional view of a coil former and an individual separate component of a cooling circulator, of a supported pot magnet for a magnetic resonance system according to the present invention. FIG. 5A is a side view of a coil former, and a cooling circulator and clamps thereof, of a supported pot magnet for a magnetic resonance system according to the present invention. FIG. 5B is a three-dimensional view of a supported pot magnet for a magnetic resonance system according to the present invention.

As shown in FIG. 2A, in order to fabricate a supported pot magnet 100, a coil installation tool 201 is prepared first, with the coil installation tool 201 being of a cylindrical shape; and then as shown in FIG. 2B, the coil former 102 is installed on the coil installation tool 201.

Then, as shown in FIG. 3A, with the multiple slots 109 that are parallel to each other and vertical to a central axis of the coil former 102 being provided at two ends and a middle portion of the coil former 102, the magnet coil 101 is wound in the slots 109. As shown in FIG. 3B, after the wire is wound in the slots 109 of the coil former 102, the magnet coil 101 is formed. The coil former 102 has a thermal contraction coefficient similar to that of the magnet coil 101. Otherwise, the thermal contraction difference between the coil former 102 and the magnet coil 101 may cause a failure of the magnetic resonance system. In this specific embodiment, the difference between the thermal contraction coefficient of the non-metallic material and that of the magnet coil is less than or equal to 10% of the thermal contraction coefficient of the magnet coil. In order to have very close thermal contraction coefficients between the non-metallic material and the magnet coil 101, preferably the poly-phenylene sulphide (PPS, also referred to as engineering plastics) is used as the material for fabricating the coil former 102.

After the magnet coil 101 is wound, as shown in FIG. 4A, the cooling circulator 103 is mounted on the magnet coil 101. The cooling circulator 103 comprises two semi-cylindrical separate components 40A and 40B, with the two separate components 40A and 40B being mounted on the magnet coil 101 so as to be engaged into the completed cooling circulator 103 in cylindrical shape. The separate components 40A and 40B contain the multiple cooling tubes 105, respectively. The multiple cooling tubes 105 have a semicircular shape, are parallel to each other, and mated with the slots 109 of the coil former 102, i.e., the multiple cooling tubes 105 of the cooling circulator 103 can be embedded into the multiple slots 109 of the coil former 102. The cooling tubes 105 are provided with multiple sheet-like heat conducting members 106 thereon that are made of a metal having good thermal conducting performance. The heat conducting members 106 proceed vertically to the cooling tubes 105 and are uniformly distributed at an inner side of the circumference of the cooling tubes 105. The heat conducting members 106 having a length matching the inner diameter of the slots 109 so as to directly contact with the magnet coil 101. The refrigerant inlet tube 104 and the refrigerant outlet tube 108 are arranged at two ends of the cooling tubes 105 vertically to the plurality of cooling tubes 105, with the refrigerant inlet tube 104 and the refrigerant outlet tube 108 being in communication with each of the cooling tubes 105, to provide refrigerant circulation for each of the cooling tubes 105. The two separate components are engaged into a complete cooling circulator 103 to cover the slots 109 in the coil former 102, so as to cool the magnet coil 101 wound in the slots 109.

The heat conducting members 106 can not only be sheet-like but also be of a cylindrical shape. The main function of the heat conducting members 106 is to increase the thermal contact area between the cooling tubes and the magnet coil, thereby improving the cooling efficiency and avoiding the physical damage caused by the direct contact between the cooling tubes and the magnet coil at the same time.

As shown in FIG. 4B, the separate component 40B has already been mounted on the magnet coil 101, but the separate component 40A has not.

As shown in FIG. 5A, the cooling circulator 103 comprises the clamps 107, the refrigerant inlet tube 104, and the refrigerant outlet tube 108. As shown in FIG. 5B, while mounting, the two separate components 40A and 40B are fixed by the respective plurality of clamps 107 at two sides of the circumference. In addition to fixing the separate components, the clamps 107 further provide a proper force for the thermal contact between the magnet coil 101 and the heat conducting members 106. After being combined, the refrigerant inlet tubes and the refrigerant outlet tubes of the two separate components 40A and 40B are respectively fixed together by means of the clamps 107, thereby forming the refrigerant inlet tube 104 and the refrigerant outlet tube 108.

Because each of the separate components mentioned above can be fabricated independently by appropriate apparatus and procedure, thus the assembly precision thereof can be ensured. The heat conducting members are mounted onto the cooling tubes of the separate components by means of, for example, welding.

After the cooling circulator 103 is mounted on the magnet coil 101, the cooling circulator 103, the magnet coil 101, and the coil former 102 are integrated using a resin, thereby increasing the thermal contact between the heat conducting members 106 on the cooling circulator 103 and the magnet coil 101. In order to further improve the strength of the complete structure, glass beads may be added to the resin.

In summary, a supported pot magnet is disclosed that has a magnet coil and a coil former, with the coil former being made of a non-metallic material, and the non-metallic material having a thermal contraction coefficient the same as that of the magnet coil. The supported pot magnet further has a cooling circulator that has two identical separate components with a semi-cylindrical shape, each containing multiple cooling tubes, a refrigerant inlet tube, a refrigerant outlet tube, and multiple clamps. The cooling tubes have a semicircular shape and are mated with the slots; the cooling tubes are provided thereon with a plurality of heat conducting members which are vertically disposed at an inner side of the cooling tubes. The refrigerant inlet tube and the refrigerant outlet tube are vertically mounted at two ends of the cooling tubes and in communication with the cooling tubes. The clamps are disposed on the refrigerant inlet tube and the refrigerant outlet tube. The present invention solves the problem of the superconducting magnet losing its superconducting state due to the difference between the thermal contraction coefficients of metallic materials and non-metallic materials, and has the advantages of being easy to fabricate and able to ensure assembly precision.

Although modifications and changes may be suggested by those skilled in the art, it is the intention of the inventors to embody within the patent warranted hereon all changes and modifications as reasonably and properly come within the scope of their contribution to the art.

We claim as our invention:
1. A supported pot magnet, comprising:
a superconducting magnet coil;
a coil former comprised of non-metallic material;
a cooling circulator that circulates a coolant in said cooling circulator that places said superconducting coil in a superconducting state by thermal communication between said coolant and said superconducting coil;
said coil former comprising a plurality of slots, and said magnet coil being wound in said plurality of slots, and said cooling circulator being mounted on said coil former, with said coil former being in simultaneous mechanical contact with said superconducting magnet coil and said cooling circulator;

said coil former and said superconducting magnet coil having a difference between respective thermal contraction coefficients of said non-metallic material and said superconducting magnet coil that maintains said thermal communication by said difference being less than or equal to 10% of the thermal contraction coefficient of the superconducting magnet coil; and said cooling circulator comprising two separate, engaged components on said coil former, each of the separate components comprising a plurality of cooling tubes, a refrigerant inlet tube, a refrigerant outlet tube, and a plurality of clamps, said plurality of cooling tubes having a semicircular shape and mated with said slots, said refrigerant inlet tube and said refrigerant outlet tube being respectively mounted at two ends of said plurality of cooling tubes and in communication with said plurality of cooling tubes, and said plurality of clamps being disposed on said refrigerant inlet tube and said refrigerant outlet tube, so as to engage said two separate components.

2. The supported pot magnet as claimed in claim 1, wherein said two separate components are identical.

3. The supported pot magnet as claimed in claim 1, wherein said cooling circulator comprises a plurality of metallic thermally conducting members, having a width matching an inner diameter of the slots, uniformly distributed at an inner side of said cooling tubes and proceeding vertically to said cooling tubes, said heat conducting members being in direct contact with the superconducting magnet coil.

4. The supported pot magnet as claimed in claim 3, wherein said heat conducting members have a sheet shape or a cylindrical shape.

5. The supported pot magnet as claimed in claim 1, wherein said non-metallic material is poly-phenylene sulphide.

6. The supported pot magnet as claimed in claim 1 comprising a resin that encapsulates said coil former with said superconducting magnet coil and said cooling circulator mounted thereon.

7. The supported pot magnet as claimed in claim 6 wherein said resin is blended with glass beads.

* * * * *